United States Patent [19]
Lou

[11] Patent Number: 6,090,664
[45] Date of Patent: Jul. 18, 2000

[54] METHOD FOR MAKING A STACKED DRAM CAPACITOR

[75] Inventor: Chine-Gie Lou, Hsinchu Hsien, Taiwan

[73] Assignee: Worldwide Semiconductor Manufacturing Corporation, Hsinchu, Taiwan

[21] Appl. No.: 09/121,021

[22] Filed: Jul. 22, 1998

[51] Int. Cl.[7] .............................................. H01L 21/8242
[52] U.S. Cl. ........................................... 438/255; 438/398
[58] Field of Search .................................. 438/238–240, 438/250–256, 381, 393–399

[56] References Cited

U.S. PATENT DOCUMENTS 5,858,838  1/1999  Wang et al. ............................ 438/255
5,874,336  2/1999  Cherng et al. .......................... 438/255

*Primary Examiner*—Jey Tsai
*Attorney, Agent, or Firm*—Blakely, Sokoloff, Taylor & Zafman, LLP

[57] ABSTRACT

A method of forming a capacitor for a stacked DRAM memory cell. A contact hole is formed in a dielectric stack of an interlayer dielectric, a first nitride layer, a high temperature oxide (HTO) layer, and a second nitride layer. An in-situ doped amorphous silicon segment is formed in and over the contact hole. The second nitride layer is removed and then a hemispherical grain (HSG) polysilicon layer is formed over the amorphous silicon segment. The HTO layer is removed and a capacitor dielectric layer is formed over the HSG polysilicon layer. Finally, a top conductive layer is formed over the capacitor dielectric layer.

10 Claims, 3 Drawing Sheets

METHOD FOR MAKING A STACKED DRAM CAPACITOR

TECHNICAL FIELD OF THE INVENTION

This invention relates to semiconductor memories, and more particularly, to an improved method for making a DRAM capacitor.

BACKGROUND OF THE INVENTION

It has been a recent trend in dynamic random access memory (DRAM) to increase the density of DRAM integrated circuits. However, as higher density DRAM cells are developed, the area available for capacitors that are used in the DRAM cells decreases. In order to decrease the area of capacitors while maintaining reliability standards, it is important to be able to maintain the capacitance of each capacitor while decreasing its area. Recently, capacitors having a three-dimensional structure have been suggested to increase cell capacitance. Such capacitors include, for example, double-stacked, fin-structured, cylindrical, spread-stacked, and box structured capacitors.

There is also a challenge to develop methods of manufacturing these capacitors that minimize the manufacturing costs and provide maximum process tolerance to maximize product yields. The present invention is directed to such an improved capacitor.

SUMMARY OF THE INVENTION

A method of forming a capacitor for a DRAM memory cell is disclosed. The method comprises the steps of: forming an interlayer dielectric; forming a first nitride layer over said interlayer dielectric layer; forming a high temperature oxide (HTO) layer over said first nitride layer; forming a second nitride layer over said HTO layer; forming a contact hole in said first and second nitride layer, said HTO layer, and said interlayer dielectric; forming an in-situ doped amorphous silicon layer in said contact hole and over said second nitride layer; patterning and etching said amorphous silicon layer to leave an amorphous silicon segment in over said contact hole; removing said second nitride layer; forming a hemispherical grain (HSG) polysilicon layer on said amorphous silicon segment; removing said HTO layer; forming a dielectric layer over said HSG polysilicon layer and said amorphous silicon segment; and forming a top conductive layer over said dielectric layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention will be described in detail with reference to the accompanying drawings. The present invention provides a method of forming a DRAM capacitor.

Figure 1:
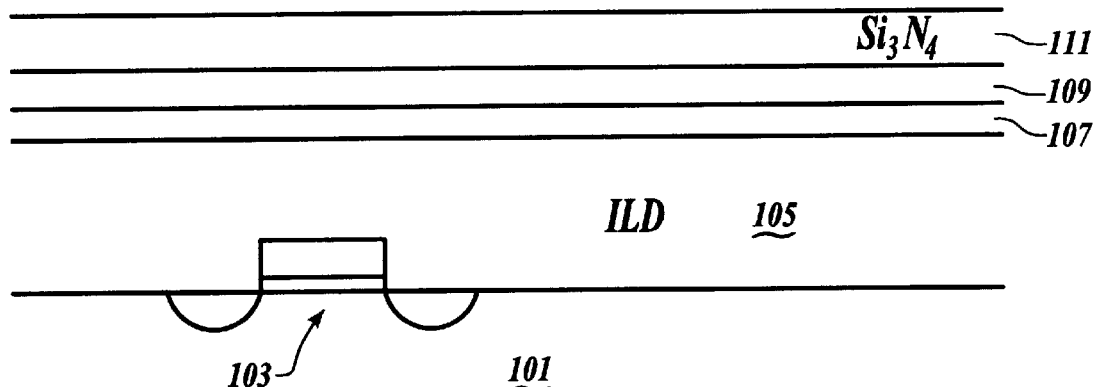
FIGS. 1–6 are cross-sectional views of a semiconductor substrate illustrating the steps of the present invention for forming a capacitor.

Turning to FIG. 1, using conventional techniques, a semiconductor substrate 101 having formed thereon an access transistor 103 is shown. Formed atop the access transistor 103 is an interlayer dielectric (ILD) 105. The interlayer dielectric 105 is typically formed from combination layers of silicon dioxide, tetraethylorthosilicate (TEOS) oxide, or BPSG layers and serves as insulation and planarization. In the preferred embodiment, the ILD 105 is a sandwich of TEOS oxide, BPSG, and TEOS oxide.

Then, a first nitride layer 107, preferably $Si_3N_4$, is deposited over the ILD 105. Preferably, the first nitride layer 107 is formed using CVD techniques and to a thickness of 500–1500 angstroms. Next, a high temperature oxide (HTO) layer 109 is formed over the first nitride layer 107. As will be seen below, the purpose of the HTO layer 109 is to act as a barrier layer during a wet etching step and provide a larger process window during the HSG polysilicon forming step. Preferably, the HTO layer 109 is formed using CVD techniques and to a thickness of 500–1500 angstroms. Next, a second nitride layer 111, preferably $Si_3N_4$, is deposited over the HTO layer 109. Preferably, the second nitride layer 111 is formed using CVD techniques and to a thickness of 500–1500 angstroms.

Figure 2:
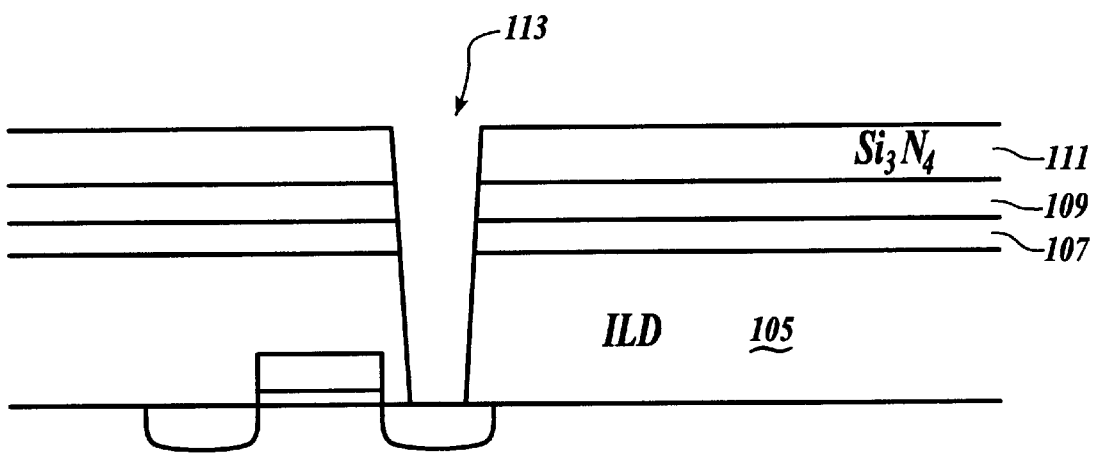

Turning to FIG. 2, a contact hole 113 is opened in the second nitride layer 111, the HTO layer 109, the first nitride layer 107, and the ILD 105 by conventional patterning and etching techniques.

Figure 3:
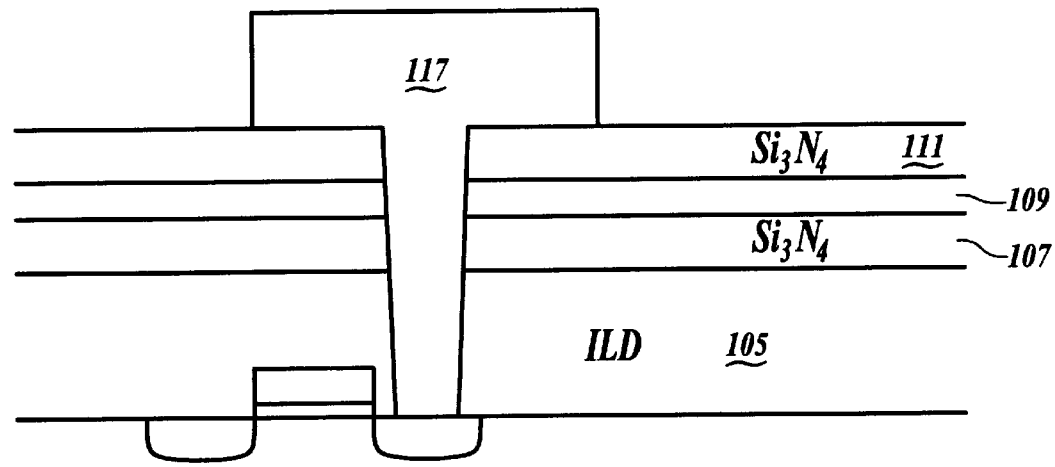

Next, turning to FIG. 3, a layer of in-situ doped amorphous silicon 117 is then formed using conventional CVD techniques to a thickness of 3000–8000 angstroms. For example, silane and phosphane may be used as the reactant gas. A deposition temperature of the in-situ doped amorphous silicon is preferably between 500° and 530° C. The amorphous silicon layer 117 is deposited into the contact hole 113 and over the top of the second nitride layer 111. Then, the amorphous silicon layer 117 is patterned and etched to leave a section of amorphous silicon over and in the contact hole 113.

Figure 4:
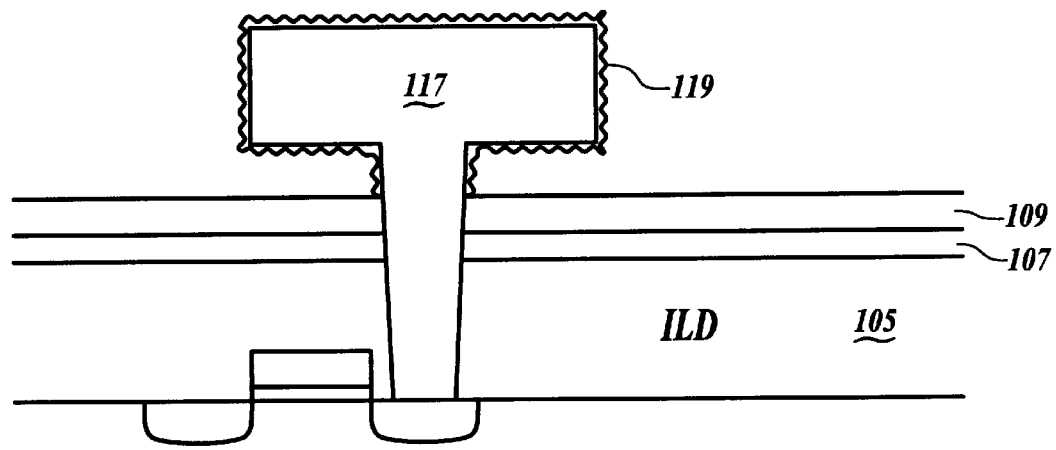

Next, turning to FIG. 4, a wet dip nitride etch of the second nitride layer 111 is performed. This can preferably be performed using a hot $H_3PO_4$ solution. Note that the HTO layer 109 is used as an etching barrier layer. After the wet dip nitride etch, hemispherical grain (HSG) polysilicon 119 is formed over the amorphous silicon layer 117. In the preferred embodiment, the HSG polysilicon is formed using a seeding and high vacuum technique. In summary, silane ($SiH_4$) or disilane ($Si_2H_6$) is used to seed the surface of the amorphous silicon. Next, the HSG polysilicon is formed in a high vacuum. The advantage of this preferred method is to only form the HSG polysilicon on the surface of the amorphous silicon. The purpose of the HTO layer 109 is to provide a larger process window during the HSG polysilicon forming step. The resulting structure is shown in FIG. 4.

Figure 5:
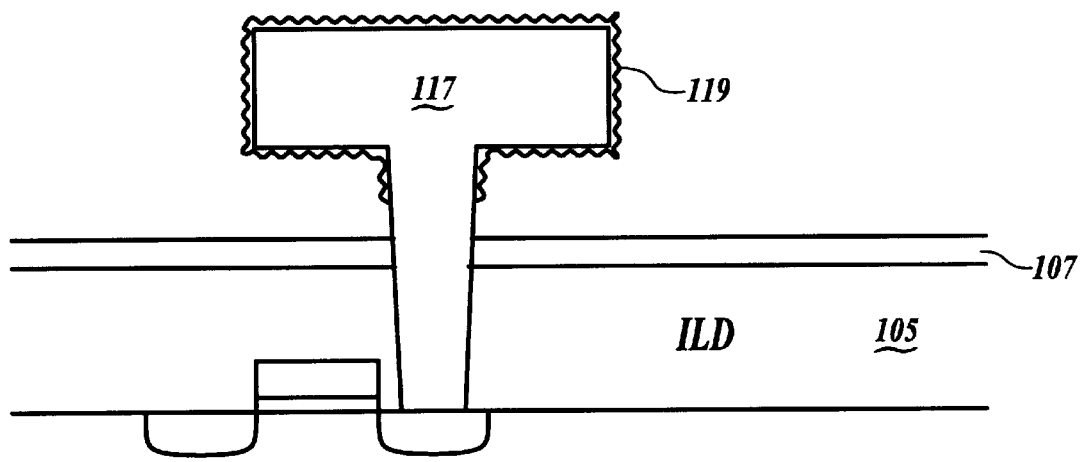

Turning to FIG. 5, the HTO layer 109 is removed using a wet dip oxide etch. Preferably, a buffered oxide etch or a dilute HF solution is used for the etching step. The first nitride layer 107 is used as a barrier layer during the wet dip oxide etch. The bottom storage node of the capacitor is thus formed. Further, although shown only in cross section, it can be appreciated by those skilled in the art that the bottom storage node is preferably of circular shape. However, the bottom storage node may be of any arbitrary shape.

Figure 6:
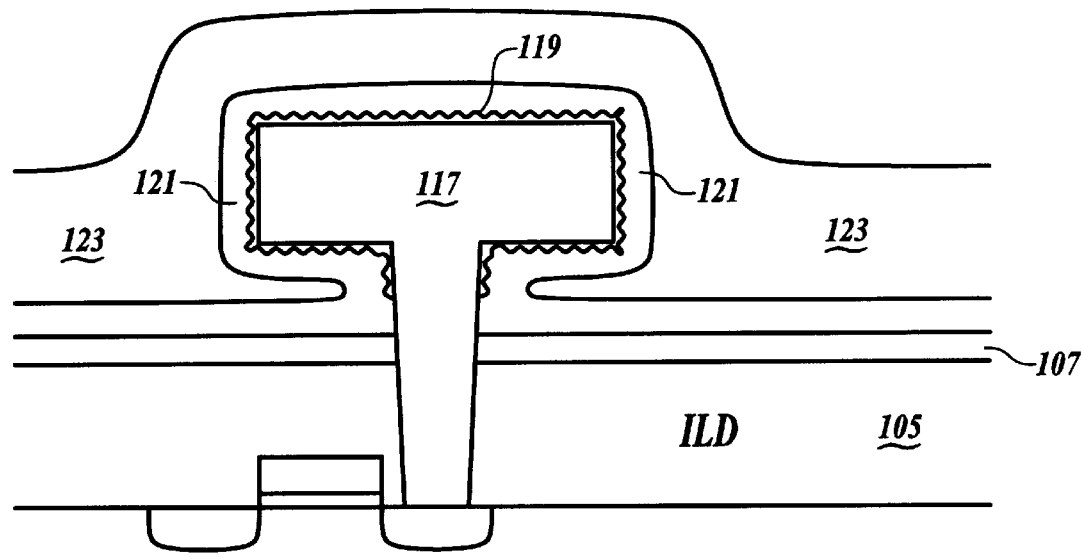

Finally, to complete the capacitor, turning to FIG. 6, any conventional capacitor dielectric 121 (such as oxide/nitride/oxide) is deposited and a final top layer of in-situ doped polysilicon 123 is deposited.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming a capacitor for a DRAM memory cell, the method comprising the steps of:

forming an interlayer dielectric;

forming a first nitride layer over said interlayer dielectric layer;

forming a high temperature oxide (HTO) layer over said first nitride layer;

forming a second nitride layer over said HTO layer;

forming a contact hole in said first and second nitride layer, said HTO layer, and said interlayer dielectric;

forming an in-situ doped amorphous silicon layer in said contact hole and over said second nitride layer;

patterning and etching said amorphous silicon layer to leave an amorphous silicon segment in over said contact hole;

removing said second nitride layer;

forming a hemispherical grain (HSG) polysilicon layer on said amorphous silicon segment;

removing said HTO layer;

forming a dielectric layer over said HSG polysilicon layer and said amorphous silicon segment; and forming a top conductive layer over said dielectric layer.

2. The method of claim 1 wherein said dielectric layer is ONO.

3. The method of claim 1 wherein said amorphous silicon layer has a thickness of between 3000–8000 angstroms.

4. The method of claim 1 wherein said HTO layer has a thickness of between 500–1500 angstroms.

5. The method of claim 1 wherein said first nitride layer is formed from $Si_3N_4$ and is between 500–1500 angstroms thick.

6. A method of making a bottom storage node of a capacitor, the method comprising the steps of:

forming a first nitride layer;

forming a high temperature oxide (HTO) layer over said first nitride layer;

forming a second nitride layer over said HTO layer;

forming a contact hole in said first and second nitride layer and said HTO layer;

forming an in-situ doped amorphous silicon layer in said contact hole and over said second nitride layer;

patterning and etching said amorphous silicon layer to leave an amorphous silicon segment in over said contact hole;

removing said second nitride layer;

forming a hemispherical grain (HSG) polysilicon layer on said amorphous silicon segment; and removing said HTO layer.

7. The method of claim 6 wherein said dielectric layer is ONO.

8. The method of claim 6 wherein said amorphous silicon layer has a thickness of between 3000–8000 angstroms.

9. The method of claim 6 wherein said HTO layer has a thickness of between 500–1500 angstroms.

10. The method of claim 6 wherein said first nitride layer is formed from $Si_3N_4$ and is between 500–1500 angstroms thick.

* * * * *